(12) United States Patent
Britz et al.

(10) Patent No.: US 10,774,437 B2
(45) Date of Patent: Sep. 15, 2020

(54) METHOD AND APPARATUS FOR ELECTROLYTICALLY DEPOSITING A DEPOSITION METAL ON A WORKPIECE

(71) Applicant: Atotech Deutschland GmbH, Berlin (DE)

(72) Inventors: Dominik Britz, Saarlouis (DE); Bernd Schmitt, Nuremberg (DE); Bernd Böse, Nuremberg (DE); Frank Mücklich, Schwalbach (DE); Christian Selzner, Saarbrücken (DE)

(73) Assignee: Atotech Deutschland GmbH, Berlin (DE)

( * ) Notice: Subject to any disclaimer, the term of this patent is extended or adjusted under 35 U.S.C. 154(b) by 148 days.

(21) Appl. No.: 15/670,744

(22) Filed: Aug. 7, 2017

(65) Prior Publication Data

US 2017/0335485 A1    Nov. 23, 2017

Related U.S. Application Data

(62) Division of application No. 14/396,348, filed as application No. PCT/EP2013/057946 on Apr. 16, 2013, now Pat. No. 9,745,665.

(30) Foreign Application Priority Data

Apr. 25, 2012   (DE) .................. 10 2012 206 800

(51) Int. Cl.
    *C25D 17/28*   (2006.01)
    *C25D 17/00*   (2006.01)
    (Continued)

(52) U.S. Cl.
    CPC ........... *C25D 17/28* (2013.01); *C25D 17/005* (2013.01); *C25D 17/06* (2013.01); *H05K 3/241* (2013.01)

(58) Field of Classification Search
    CPC . C25D 7/28; C25D 7/06; C25D 7/005; C25D 17/28; C25D 17/06; C25D 17/005; H05K 3/241
    See application file for complete search history.

(56) References Cited

U.S. PATENT DOCUMENTS 3,701,726 A    10/1972  Laboue
4,755,271 A *   7/1988  Hosten ................... C25D 17/00
                                                    204/198

(Continued)

FOREIGN PATENT DOCUMENTS

AU    WO2011/056037 A1    5/2011
CA         2341218 A1      3/2000

(Continued)

OTHER PUBLICATIONS

International Preliminary Report on Patentability, PCT/IPEA/409 (English Translation), dated Apr. 16, 2013.

*Primary Examiner* — Louis J Rufo
(74) *Attorney, Agent, or Firm* — Bonini IP Law, LLC; Frank J. Bonini, Jr.

(57) ABSTRACT

For improving the current transfer during the electrolytic metallization of workpieces, a method is proposed: (a) providing a metal depositing apparatus 17, in which the workpiece, at least one anode 40, 41 and a metal deposition electrolyte AE are arranged and which has a device for electric current generation 60 and at least one current feeding device 31 with in each case at least one electrical contact element 34, 35 for making electrical contact with the workpiece; (b) bringing the at least one electrical contact element 34, 35 into contact with the workpiece; and (c) feeding electric current to the workpiece via the at least one electrical contact element 34, 35 in order that the deposition metal deposits on the workpiece. Before method step (b), in (Continued)

Figure 1:
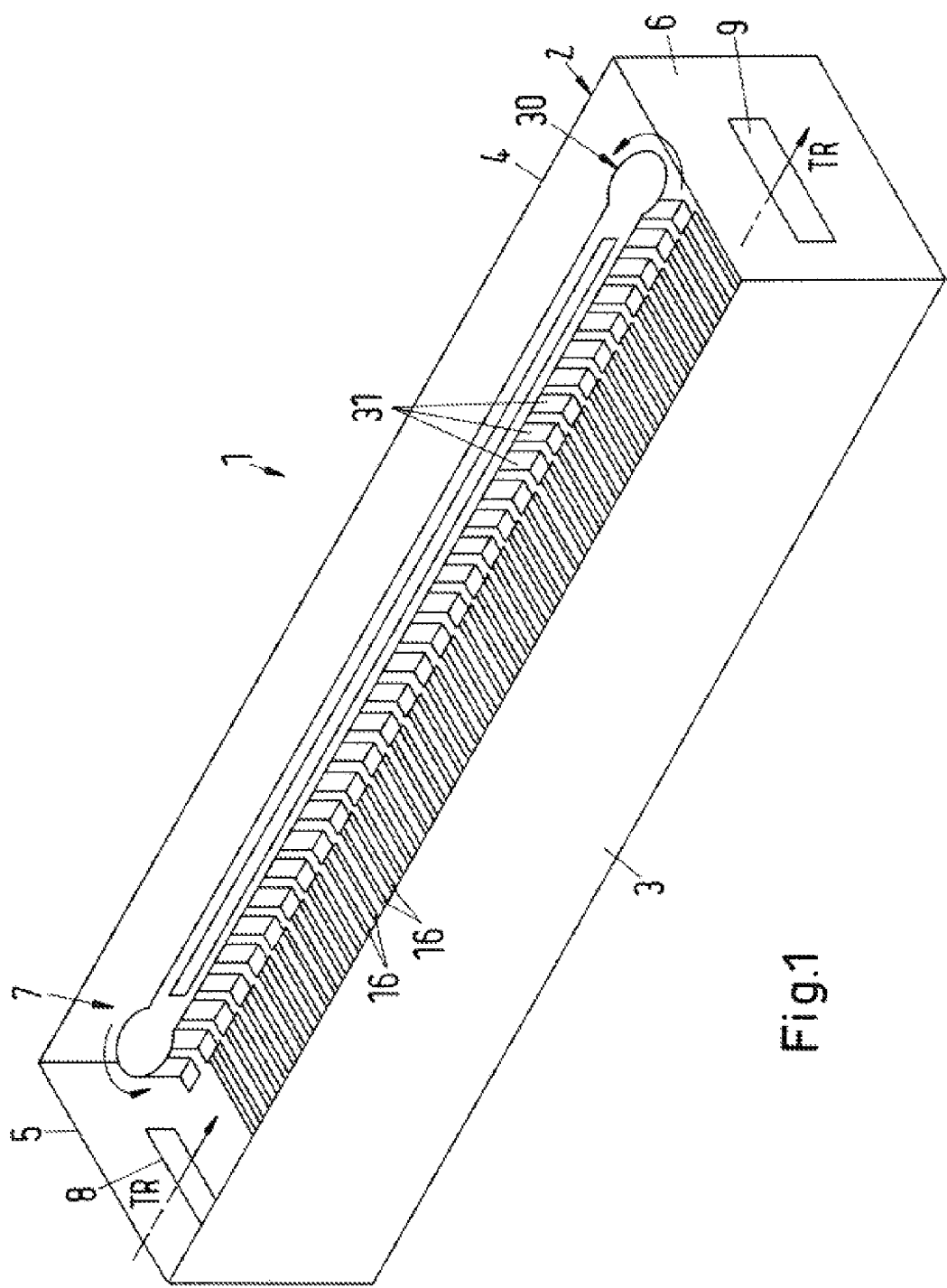

a further method step (d), deposition metal is deposited on the at least one electrical contact element 34, 35.

21 Claims, 7 Drawing Sheets

(51) Int. Cl.
  *C25D 17/06* (2006.01)
  *H05K 3/24* (2006.01)

(56) References Cited

U.S. PATENT DOCUMENTS

| | | | | |
|---|---|---|---|---|
| 4,776,939 A | * | 10/1988 | Blasing | C25D 17/28 204/202 |
| 4,776,969 A | | 11/1988 | Bläsing et al. | |
| 5,932,081 A | * | 8/1999 | Kopp | H05K 3/241 118/503 |
| 6,319,383 B1 | * | 11/2001 | Kopp | C25D 17/06 205/96 |
| 6,887,113 B1 | | 5/2005 | Langheinrich | |
| 2004/0074775 A1 | | 4/2004 | Herdman | |
| 2005/0145499 A1 | * | 7/2005 | Kovarsky | C25D 5/18 205/103 |
| 2008/0128289 A1 | | 6/2008 | Hubel | |
| 2009/0178900 A1 | * | 7/2009 | Scheller | C25D 17/06 198/617 |
| 2010/0170802 A1 | * | 7/2010 | Kawashita | C25D 7/00 205/137 |

FOREIGN PATENT DOCUMENTS

| | | |
|---|---|---|
| DE | 3624481 A1 | 1/1988 |
| DE | 10 2005 034 419 A1 | 1/2007 |
| DE | 102005034419 A1 | 1/2007 |
| DE | 10 2007 030 821 A1 | 1/2009 |
| DE | 102007030821 A1 | 1/2009 |
| DE | 10 2007 055 338 A1 | 5/2009 |
| DE | 102007055338 A1 | 5/2009 |
| EP | 1 115 915 B1 | 7/2001 |
| EP | 1115915 B1 | 7/2001 |
| WO | WO 2011/054037 A1 | 5/2011 |

* cited by examiner

A) Providing a metal deposition apparatus 17, in which the workpiece WS, at least one anode 40, 41 and a metal deposition electrolyte AE are arranged and which has a device for electric current generation 60 and at least one current feeding device 31 with in each case at least one electrical contact element 34, 35 for making electrical contact with the workpiece WS.

B) Depositing the deposition metal on the at least one electrical contact element 34, 35.

C) Bringing the at least one electrical contact element 34, 35 into contact with the workpiece WS.

D) Feeding electric current to the workpiece WS via the at least one electrical contact element 34, 35 in order that the deposition metal deposits on the workpiece WS.

E) Removing deposition metal present from the at least one electrical contact element 34, 35.

F) Repeating method steps B) to E).

Fig. 6

METHOD AND APPARATUS FOR ELECTROLYTICALLY DEPOSITING A DEPOSITION METAL ON A WORKPIECE

CROSS-REFERENCE TO RELATED APPLICATIONS

This application is a divisional of U.S. application Ser. No. 14/396,348, filed on Oct. 22, 2014, the complete contents of which are herein incorporated by reference.

BACKGROUND OF THE INVENTION

1. Field of the Invention

The present invention relates to a method and an apparatus for electrolytically depositing an electrically conductive layer, in particular a metal, on a workpiece. The method and the apparatus are intended to be used in the production of planar, for example plate-shaped, workpieces or continuous foils, for example of printed circuit boards and conductor foils, wafers, solar panels, flat screen panels and the like, and during the metallization of workpieces with other forms that are used for example in the sanitary field, in the automotive industry, in mechanical engineering, or in other fields.

2. Brief Description of the Related Art

Installations for electrolytic metal coating are usually dipping bath installations or continuous installations. An apparatus of this type is described in DE 36 24 481 A1, for example. The arrangement has an electrolysis chamber, in which printed circuit boards are electrolytically coated with metal. For transporting the printed circuit boards through the chamber and for feeding current to the printed circuit boards, use is made of clamps that embrace the printed circuit boards in their transport position. Said clamps are provided in a continuously circulating driven series. The printed circuit boards are gripped in a transport region and electrical contact is made with them, such that they can be electrolytically metallized. Outside the metallization region, a demetallization chamber filled with the electrolysis liquid is provided for the clamps, in which the clamps are electrolytically freed of the metal applied during the metallization.

EP 1 115 915 B1 discloses a further electrochemical treatment installation for printed circuit boards in the form of a continuous horizontal installation. For feeding current to the printed circuit boards, use is made of a contact-making member with at least one contact element having a contact area. The contact areas can be formed by bumps, which consist of copper for better thermal conductivity. Since, during demetallization performed after the electrolytic treatment, the contact elements in accordance with EP 1 115 915 B1 would decompose if they consisted of copper, they can be coated with a resistant coating, for example made of gold. It is indicated that particularly thin base copper layers on printed circuit boards at the contact-making locations or in adjacent regions "burn" upon application of high currents, for example of 40 to 160 A, via a contact-making member, such that black locations form there, at which copper is damaged or in some instances even completely destroyed. In order to overcome this problem, said document provides for the shape of the contact area of the contact element to be formed in accordance with a specific condition.

It has been found, however, that the measures proposed in EP 1 115 915 B1 suffice only to a limited extent to solve problems when making electrical contact with the workpieces in an electrolytic metallization installation. There is primarily the need to operate the electrolytic metal deposition with a very high deposition rate, i.e. with a high current, since the costs for the metallization method can thereby be reduced. Upon application of a very high current during the metallization, alongside the problems described in the cited document, it has additionally been observed that the electrical contact elements of the current feeders can also be damaged in the course of transferring the current to the workpieces. This damage consists in the fact that the contact areas via which the contact elements of the current feeders are pressed onto the workpieces gradually erode and then become unsuitable for the current transfer.

SUMMARY OF THE INVENTION

Therefore, the present invention is based on the object of finding measures for remedying these problems and, in particular, of providing a method and an apparatus which are suitable for enabling an electrolytic metal deposition with high current. Therefore, the method and the apparatus are intended to be suitable for transferring a very high current to the workpieces, without the contact areas of the electrical contact elements or the contact-making regions and adjacent regions on the workpiece surfaces being damaged or destroyed.

This object is achieved by means of the method for electrolytically depositing a deposition metal on a workpiece and the apparatus for electrolytically depositing the deposition metal on the workpiece. Preferred embodiments of the invention are specified in the dependent claims.

In so far as terms such as workpiece, current feeding device, contact element, contact area, holding device, anode, device for electric current generation, stripping apparatus, contact coating apparatus and contact clamp are used in the singular hereinafter in the description and in the claims, in each case the corresponding term in the plural is equally meant, and vice versa, unless expressly indicated otherwise.

The method according to the invention for electrolytically depositing a deposition metal on a workpiece comprises the following method steps:

(a) providing a metal depositing apparatus, in which the workpiece, at least one anode and a metal deposition electrolyte are arranged and which has a device for electric current generation and at least one current feeding device with in each case at least one electrical contact element for making electrical contact with the workpiece (the electrical contact element is that part of the current feeding device which serves for making electrical contact with the workpiece and which has at least one contact area);

(b) bringing the at least one electrical contact element into contact with the workpiece; and (c) feeding electric current to the workpiece via the at least one electrical contact element in order that the deposition metal deposits on the workpiece.

In the manner according to the invention, before method step (b), in a further method step (d), the deposition metal is deposited on the at least one electrical contact element, in particular on the respective contact area of the at least one electrical contact element.

The deposition metal deposited in method step (d) covers the contact area of the electrical contact element to an extent of more than 50%, preferably completely. Pores possibly present in the deposition metal layer are harmless. As a result, the contact area of the electrical contact element can come into contact with the workpiece surface for the most part or completely via this deposited deposition metal layer.

If there is a predefined time period between producing the deposition metal layer on the contact area in accordance with method step (d) and bringing the contact area into contact with the workpiece in accordance with method step (b), in which time period the electrical contact element is not cathodically polarized, i.e. free of current, part of the deposited deposition metal layer can decompose again in the deposition electrolyte. In this case, a sufficiently thick deposition metal layer is to be produced on the contact area, such that a deposition metal layer that is as closed as possible is still present even after said time period has elapsed. The layer thickness of the deposition metal on the contact area before contact is made with the workpiece is intended to be at least 0.5 µm, preferably at least 2 µm, particularly preferably at least 5 For economic reasons, the layer formed is intended as far as possible not to be thicker than 50 µm.

The apparatus according to the invention comprises:
(a) at least one anode and at least one current feeding device with at least one electrical contact element for making electrical contact with the workpiece, wherein the at least one anode and the at least one current feeding device can be brought into contact with a metal deposition electrolyte, and
(b) a device for electric current generation for supplying the at least one anode and the at least one current feeding device and thus the workpiece with electric current.

According to the invention, the apparatus for electrolytically depositing the deposition metal on the workpiece furthermore comprises a contact coating apparatus for depositing the deposition metal on the electrical contact elements, in particular on the respective contact area of the electrical contact elements. In the contact coating apparatus, the at least one electrical contact element is not in contact with the workpiece.

Consequently, one measure which is essential to the invention consists in the electrical contact elements being covered with the deposition metal in particular in the region of their contact areas, via which they are in contact with the workpieces during the metallization thereof, before being brought into contact with the workpiece. That means that preferably the same metal which also serves for the metal coating of the workpieces is used for covering the electrical contact elements. This makes possible, in particular, a particularly good current transfer between current feeding device and workpiece during the metallization of the workpieces. As a result of the measures according to the invention, the contact resistance becomes very low and the local evolution of heat correspondingly becomes very low.

It has been found that the problems explained above can be overcome by the measure according to the invention. A higher current can even be applied to the contact regions, and the workpiece can be coated with the deposition metal more rapidly.

In experiments it has furthermore been confirmed that an intimate mechanical contact—necessary for producing a favourable current transfer—between the electrical contact elements and the workpieces is advantageous, i.e. it is advantageous for the contact areas to bear a really as exactly as possible on the workpiece surface. For this purpose, the fixing of the contact element to the current feeding device can be fashioned in such a way that it is flexible within a specific region in order for example to compensate for a deviation of the contact area from the parallel position with respect to the transport plane. The elasticity of this fixing enables an automatic alignment of the contact area parallel to the workpiece surfaces, wherein the force with which the contact elements of the clamp are pressed together has to be high enough to align the contact areas with the workpiece surface. Preferably, the contact areas of the electrical contact elements are plane (planar) in order to achieve a good current transfer.

Furthermore, it can be advantageous if the base material, for example titanium, of the current feeding device, in particular of the contact element, has a certain roughness at the surface, in particular the contact area, in order to achieve an intimate and adhesively strong connection between the base material and the deposited metal of the contact coating. The roughness value Ra can be in a range of 0.2 to 10 µm, preferably 0.5 to 5 µm.

In order to achieve a good current transfer at the contact location, a pressure per unit area of the contact area on the workpiece of 0.15 to 2.5 $N/mm^2$, preferably 0.3 to 1.5 $N/mm^2$, has proved to be advantageous.

In accordance with one preferred development of the present invention, the deposition metal present on the at least one electrical contact element is removed before method step (d) in a further method step (e). Said deposition metal may have been applied on the electrical contact element during a previous use for making electrical contact with the workpiece. Consequently, said method step (e) can also be carried out following method step (c) or after method step (c) and after the contact between the current feeding device and the workpiece has been released again. As a result of this additional step of demetallization in the case of a repeated use of the current feeding devices for making electrical contact with the workpieces, before method step (d), an identical state of the contact areas with regard to an adhesion of deposition metal is always established reproducibly. Preferably, the contact areas are covered with deposition metal to an extent of less than 10% after demetallization.

In order to remove the deposition metal deposited on the at least one current feeding device during the electrolytic metallization of the workpiece, the apparatus according to the invention can comprise a stripping apparatus, preferably an electrolytic stripping apparatus.

In accordance with a further preferred development of the present invention, the apparatus according to the invention for electrolytically depositing a deposition metal on the workpiece is designed to the effect that the metal deposition on the workpieces in accordance with method step (c) and also the demetallization of the electrical contact elements in accordance with method step (e) and the deposition of deposition metal on the electrical contact elements in accordance with method step (d) take place in said apparatus. Consequently, the apparatus according to the invention comprises a first region, in which the workpieces are coated with deposition metal, a second region, in which the current feeding devices are freed again of metal deposited thereon, and a third region, in which deposition metal is deposited on the electrical contact elements. The second region of the apparatus according to the invention is therefore formed by the stripping apparatus, and the third region by the contact coating apparatus. As a result of this design, the current feeding devices can be continuously used cyclically, since, after the metallization of a workpiece, during which they are likewise concomitantly metallized, they are prepared for the next metallization process in the stripping apparatus and the contact coating apparatus.

Consequently, the apparatus according to the invention in this embodiment variant comprises not only the metallization apparatus but also the stripping apparatus and the contact coating apparatus. In principle, however, the two latter apparatuses can also be provided jointly or in each case separately in a different apparatus from the metallization apparatus. By way of example, it is possible to use the latter variant when using a vertical installation in which separate containers are provided for the metal coating of the workpieces (metallization apparatus), for the demetallization of the current feeding devices (stripping apparatus) and for the coating of the current feeding devices with deposition metal (contact coating apparatus). Moreover, the three regions can be separated from one another by separating devices such as walls or spacings, for example spacings larger than 100 mm, in such a way that instances of mutual influencing by field lines are suppressed or avoided.

In accordance with a further preferred development of the present invention, the deposition metal is copper. The electrical contact element can be produced from titanium. Titanium is resistant in the deposition electrolytes usually used for copper deposition. Alternatively, the electrical contact elements can also consist of a different metal, such as, for example, niobium and high-grade steel.

In accordance with a further preferred development of the present invention, in method step (d), in addition to the in each case at least one electrical contact element of the at least one current feeding device, deposition metal is also deposited on parts of the at least one current feeding device, adjacent to the respective at least one electrical contact element. This is done by means of a suitable geometric arrangement of the anodes of the contact coating apparatus with respect to the current feeding device, such that field lines also form sufficiently between the parts of the current feeding device which are adjacent to the contact element and the anodes. This additional coating of regions of the current feeding device which do not belong directly to the contact area ensures that the current is transferred to the contact area with a lower electrical resistance and less evolution of heat. Therefore, it should be endeavoured to ensure that the layer of the deposition metal deposited on the electrical contact elements is as thick as possible. The layer thickness of the deposition metal on the parts of the current feeding device which are adjacent to the contact element before contact is made with the workpiece is intended to be at least 0.5 µm, preferably at least 1 µm, particularly preferably at least 3 µm. An excessively thick layer should not be deposited, for economic reasons. Therefore, the layer formed in the contact coating apparatus should not be thicker than 40 µm. The electrolytic contact metal deposition on the contact areas can be carried out with a current density, relative to the areas of the current feeding device that are to be coated, of 1 A/dm$^2$ to 35 A/dm$^2$.

In accordance with a further preferred development of the method according to the invention, the workpiece is guided in a continuous apparatus for continuous electrolytic metal deposition on a preferably horizontal transport path. In the continuous installation, a plurality of current feeding devices are guided parallel to the transport path. In this case firstly the electrical contact elements of the current feeding devices are in electrical contact with the workpiece passing through the apparatus in accordance with method step (b) and, secondly, the workpiece is polarized via the electrical contact elements in accordance with method step (c). After method step (c), the electrical contact elements are firstly freed of the deposition metal deposited thereon. Subsequently, deposition metal is deposited on the electrical contact elements in accordance with method step (d). The electrical contact elements are then brought into contact with a further workpiece. Continuous methods of this type are extremely efficient since they are carried out in a compact installation, allow a high throughput and enable automatic operation.

Consequently, the apparatus according to the invention for electrolytically depositing a deposition metal on a workpiece is preferably a continuous apparatus for continuous electrolytic metal deposition with a plurality of current feeding devices. In accordance with this embodiment of the invention, the current feeding devices are held on a holding device forming a circulation, wherein the apparatus has, in a first region of the circulation, a transport path for the workpiece and a guide for the current feeding devices parallel to the transport path, such that the electrical contact elements are brought into contact with the workpieces and deposition metal is deposited on the workpieces. Furthermore, the apparatus is designed, at the end of the first region, to release the contact between the workpieces and the electrical contact elements again. The stripping apparatus for removing deposition metal deposited on the electrical contact elements forms a second region of the circulation, and the contact coating apparatus for depositing the deposition metal on the electrical contact elements forms a third region of the circulation.

In accordance with a further preferred development of the embodiment explained above, the current feeding devices can be guided and preferably driven in the stripping apparatus and in the contact coating apparatus in a series, preferably in a continuously circulating series, and one behind another, said current feeding devices being brought into contact with an electrolyte. Preferably, the holding device for the current feeding devices is a continuously circulating transport belt or a continuously circulating transport chain or the like. The current feeding devices are preferably fixed to the holding device in a series one behind another and therefore successively pass through the individual regions. Preferably, no further electrolytically active regions are provided in addition to the first, second and third regions of the circulation.

In accordance with a further preferred development of the embodiment explained above, the deposition metal is electrolytically stripped in the second region of the circulation, such that a rapid and controlled removal of the deposition metal from the current feeding devices is achieved. This process takes place in an arrangement comprising a stripping electrode polarized cathodically relative to the current feeding device. This stripping cathode is arranged opposite the current feeding device and is fixed in an exchangeable manner.

In accordance with a further preferred development of the present invention, the at least one current feeding device is a contact clamp. With the contact clamps, the workpieces can be gripped in a clamping manner, for example, wherein a predefined pressure per unit area can be exerted on the workpiece surface by the electrical contact elements. A good current transfer from the electrical contact elements to the workpieces can thus be achieved.

In accordance with a further preferred development of the present invention, the at least one current feeding device can be driven and thus also serve in each case as a transport element for the workpieces. The holding device is preferably driven for this purpose.

In accordance with a further preferred development of the present invention, the contact clamp has two electrical contact elements each having a contact area, which are arranged parallel to one another and aligned in a manner situated opposite one another. Via these two electrical contact elements, current can be fed to both sides of an, in particular plate-shaped, workpiece, thereby enabling both sides to be metallized. By arranging the two contact elements for example each on an arm of the current feeding device, which can be braced against one another by means of an elastic element, the two arms and thus the two electrical contact elements can be prestressed into a closed position, from which they can be transferred into an open position with an opening force being applied. In the open position, the two electrical contact elements are spaced apart from one another, such that a workpiece can be arranged between them and subsequently gripped in a clamping manner. If such clamps are used in the continuous installation specified above, in which they are held on a holding device forming a circulation, they can be moved from the closed position to the open position in an outlet region from the first (metallization) region of the apparatus according to the invention, such that the two clamp parts are forced apart from one another. In a corresponding manner, the opened clamps can move together and grip the workpieces in a clamping manner in an inlet region of the first (metallization) region under the action of the elastic force. In the second region of the circulation (in the stripping apparatus) and in the third region of the circulation (in the contact coating apparatus), the clamp contact areas remain in the position spaced apart from one another.

Instead of clamps, it is also possible to use current feeding devices in a different form, for example contact wheels. The contact wheels run with their end faces on the workpiece surfaces. Contact wheel pairs comprising in each case two contact wheels situated opposite one another can be provided in order to be able to make contact with both sides of a workpiece simultaneously. The contact wheels can be segmented in order to achieve a demetallization and contact coating on the regions of the contact wheels situated opposite the workpiece surfaces. For this purpose, the segments of the contact wheels, depending on their respective rotational position, are polarized in a suitable manner relative to counterelectrodes.

The contact areas of the electrical contact elements can have a linear or strip-shaped form. They are preferably planar and smooth.

The stripping apparatus in the second region of the apparatus according to the invention has a container for receiving stripping electrolyte and at least one stripping cathode. The stripping cathode and the current feeding devices which are transferred into the stripping apparatus and polarized anodically relative to the stripping cathode are brought into contact there with the stripping electrolyte. The stripping cathode is arranged opposite the current feeding devices, and opposite the transport path of the current feeding devices in the case of a continuous apparatus. In a further preferred embodiment of the invention, the stripping cathodes are arranged between the opened, that is to say spaced apart from one another, contact elements of the current feeding devices. The stripping cathodes can therefore be arranged opposite the electrical contact elements or between two electrical contact elements spaced apart from one another. In one preferred embodiment, stripping cathodes can be opposite the electrical contact elements in a region to which the electrical contact elements move first in the stripping apparatus and further stripping cathodes can be arranged between the two electrical contact elements in a region to which the electrical contact elements move subsequently in the stripping apparatus. Furthermore, means for applying, for example nozzles, a flow of electrolyte to the regions of the current feeding devices that are to be demetallized can additionally be arranged in the stripping apparatus, in order to achieve a rapid demetallization. The stripping apparatus is designed to remove again all deposition metal that has been applied on the current feeding devices, in particular the contact areas, to an extent of more than 90%, preferably completely.

The contact coating apparatus has a container for receiving contact coating electrolyte and at least one contact coating anode. The contact coating anode and the current feeding devices which are transferred into the contact coating apparatus and polarized cathodically relative to the contact coating anode are brought into contact there with the contact coating electrolyte. The contact coating anode is arranged opposite the current feeding devices, and opposite the transport path of the current feeding devices in the case of a continuous apparatus. In a further preferred embodiment of the invention, the contact coating anodes are arranged between the opened, that is to say spaced apart from one another, contact elements of the current feeding devices. The contact coating anodes can therefore be arranged opposite the electrical contact elements or between two electrical contact elements spaced apart from one another. In one preferred embodiment, contact coating anodes can be opposite the electrical contact elements in a region to which the electrical contact elements move first in the contact coating apparatus and further contact coating anodes can be arranged between the two electrical contact elements in a region to which the electrical contact elements move subsequently in the contact coating apparatus. Furthermore, means for applying, for example nozzles, a flow of electrolyte to the regions of the current feeding devices that are to be metallized, in particular the contact areas, can additionally be arranged in the contact coating apparatus, in order to achieve a smooth metallization, having a high adhesive strength, of the electrical contact elements with the deposition metal.

Where a metallization of the current feeding devices dipped into the electrolyte is not desired, they can be surrounded by a shielding shell or be coated with an insulation layer in order to shield them from field lines.

In accordance with a further preferred development of the invention, the deposition electrolyte, the stripping electrolyte and the contact coating electrolyte have the same composition. Therefore, the containers for receiving the three electrolytes in the three regions of the apparatus according to the invention can be connected to one another, such that it is possible to transfer the electrolyte in the three regions between the containers, for example by corresponding flow control.

In accordance with a further preferred development of the invention, the second region, that is to say the stripping apparatus, is at least half as long and at most three times as long as the third region, that is to say the contact coating apparatus. Preferably, the second region is approximately (+/−30%) twice as long as the third region.

The anodes in the third region of the circulation, that is to say in the contact coating apparatus, can consist, in particular, of a material that is resistant under the conditions of electrolysis in the respective electrolytes. By way of example, a valve metal, for example Ti, which is coated with Pt or with a mixed oxide can be involved. Insoluble anodes of this type can be used together with a deposition electrolyte containing additives that form a redox pair, such as $Fe^{2+}/Fe^{3+}$. In principle, soluble anodes composed of the deposition metal can also be used.

The metallization in the metallization region and/or the demetallization in the demetallization region and/or the contact coating in the contact coating region can in each case be operated with direct current or pulsed current. In the case of pulsed current, it is possible to use a unipolar pulse train, that is to say having exclusively cathodic pulses at the contact elements in the contact coating region and anodic pulses at the electrical contact elements in the demetallization region, or a bipolar pulse train, that is to say having active pulses and, between the latter, having pulses of opposite polarity, if appropriate furthermore having pulse pauses.

The invention explained above is applicable, in particular, for the deposition of copper on workpieces, preferably from a deposition electrolyte containing copper(II) ions, sulphuric acid, chloride and customary bath additives.

In principle, the invention can also be used for the deposition of metals which bring about an improvement in the contact properties. For example when the invention serves for depositing nickel or chromium and the respective metal is deposited onto the electrical contact elements before the use of the current feeding devices for making electrical contact with the workpieces, the metal coverings thus produced can also protect the contact areas against abrasion and/or corrosion and/or impart a high hardness to them. Reduction of abrasion and of the tendency towards corrosion likewise results in an improvement in the current transfer.

BRIEF DESCRIPTION OF THE DRAWING FIGURES

Figure 2:
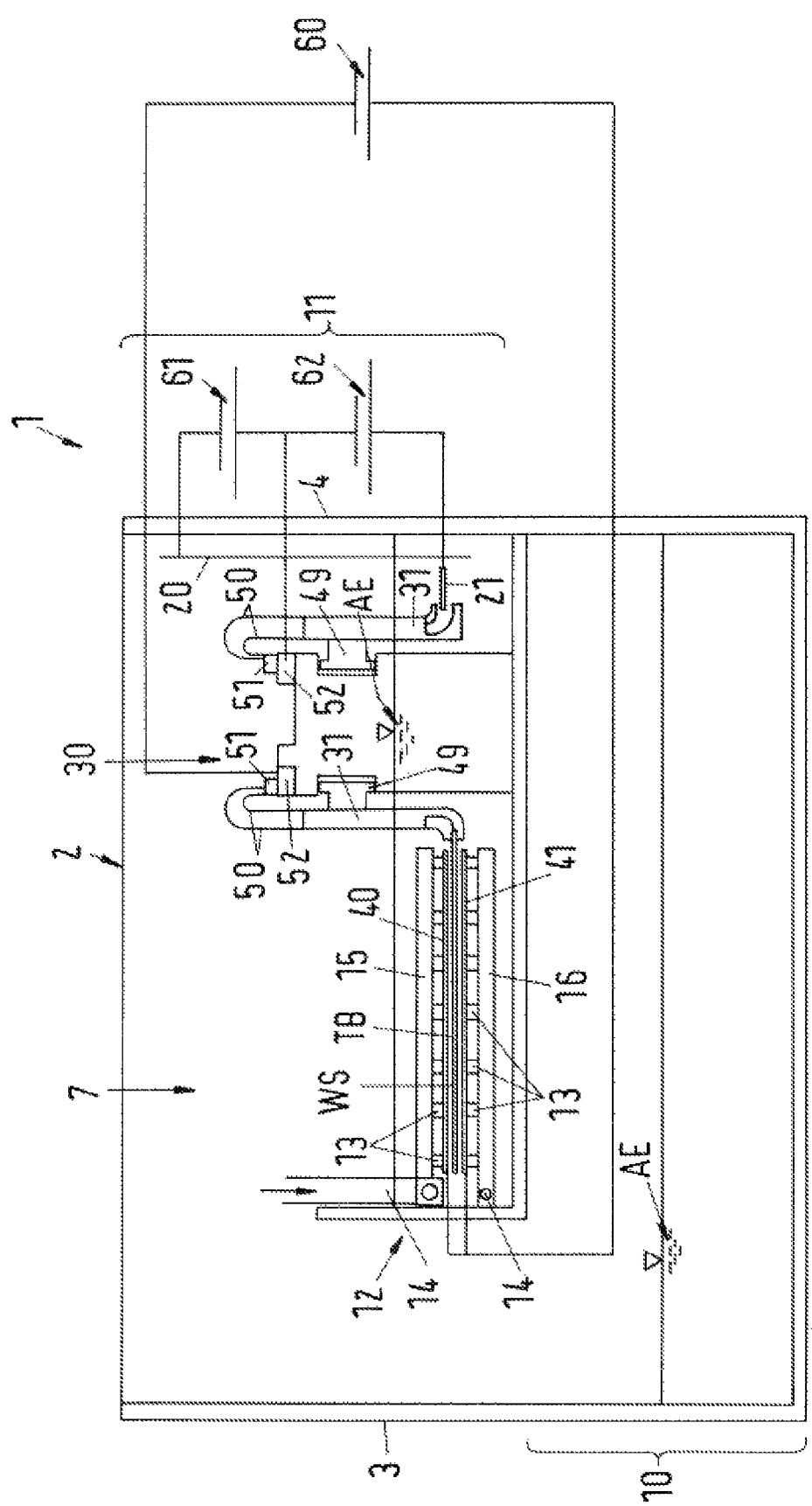
Figure 3:
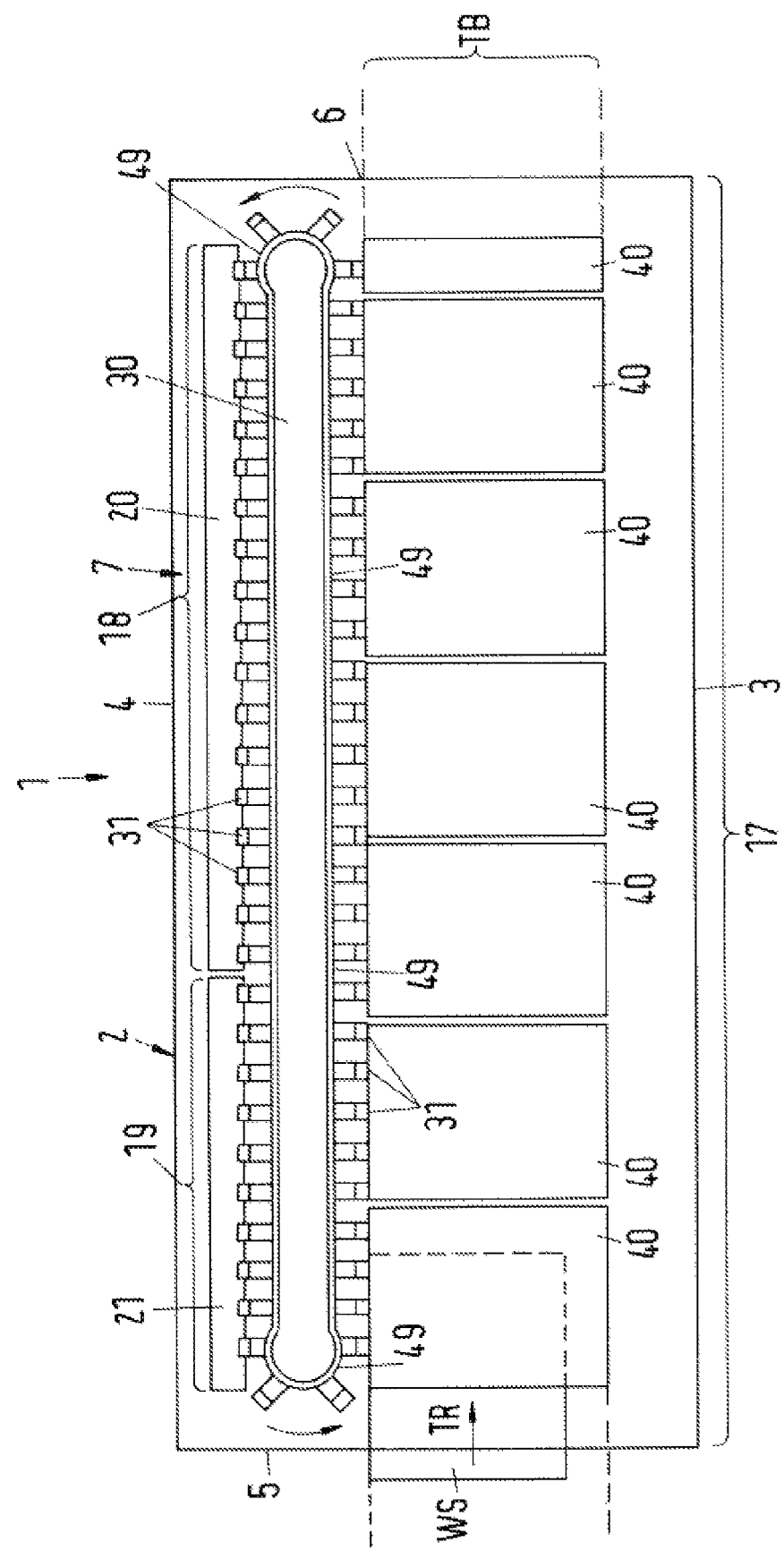
Figure 4:
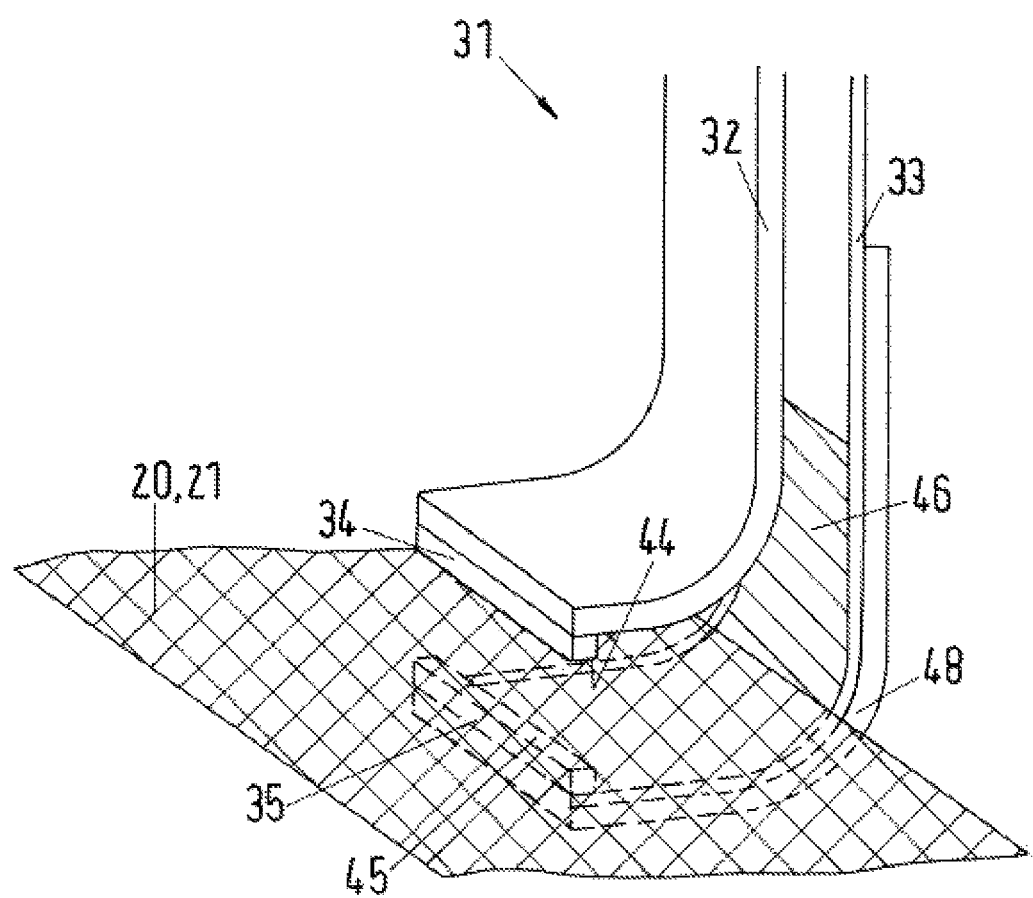
Figure 5:
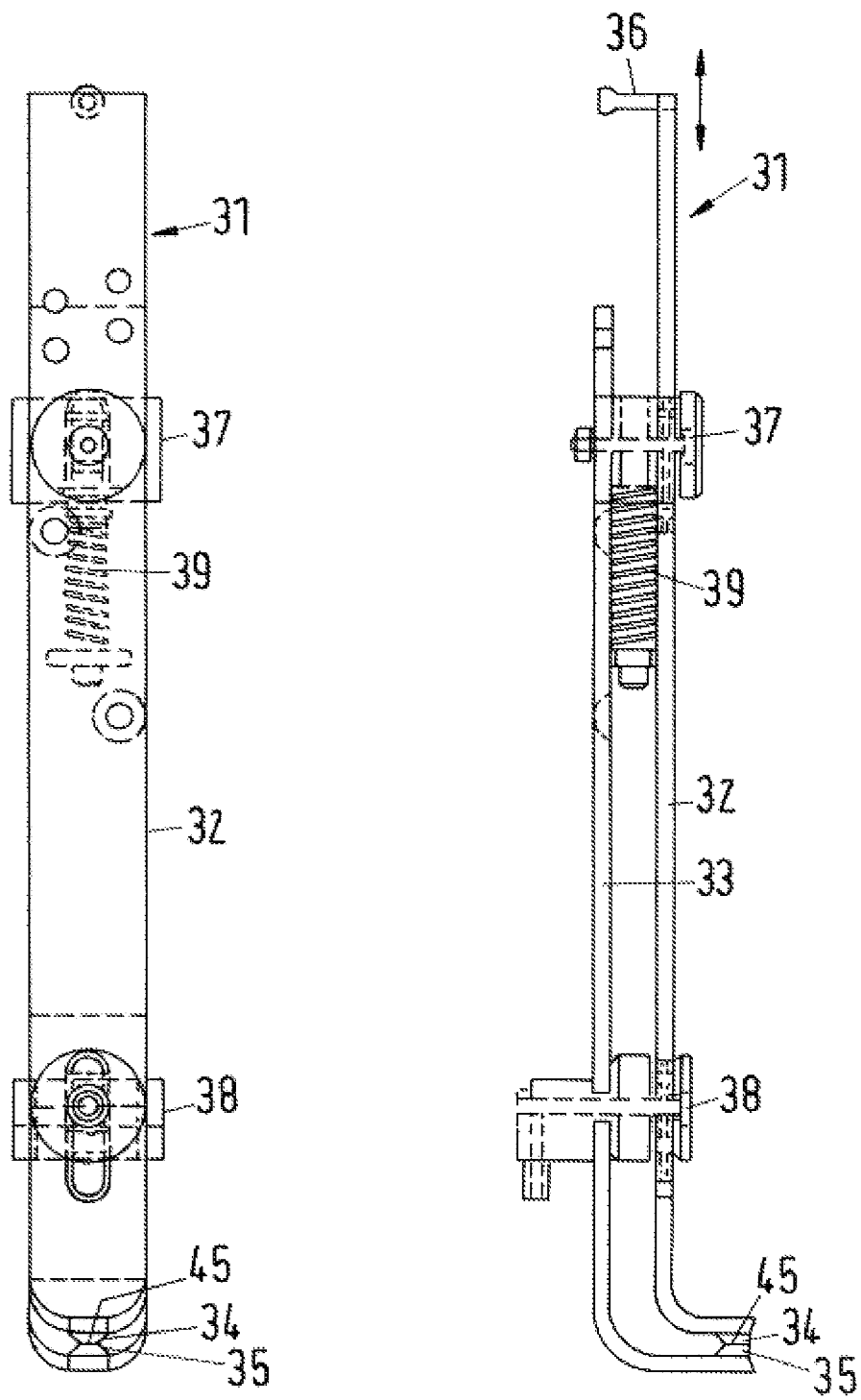
Figure 7:
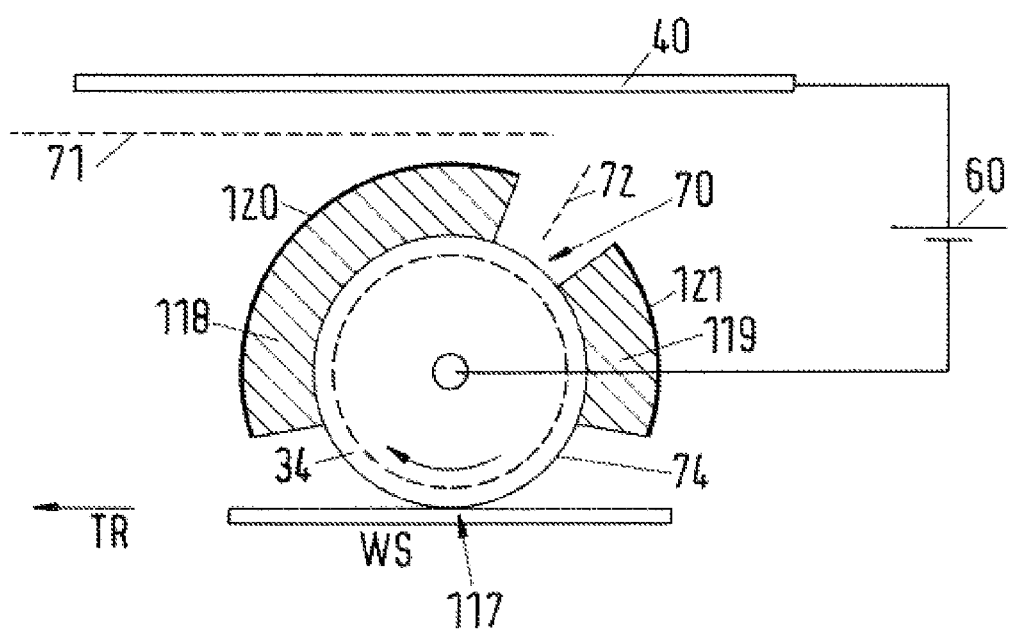

The present invention is described in greater detail with reference to the following figures:

FIG. 1: shows a perspective view of a continuous apparatus according to the invention for the treatment of printed circuit boards in a schematic illustration;

FIG. 2: shows a cross section of the continuous apparatus according to the invention for the treatment of printed circuit boards from FIG. 1 in a schematic illustration;

FIG. 3: shows a plan view of the continuous apparatus according to the invention for the treatment of printed circuit boards from FIG. 1 in a schematic illustration;

FIG. 4: shows a perspective view of a part of a current feeding device with electrical contact elements in a first embodiment;

FIG. 5: shows views of a current feeding device with two clamp members, which can be braced against one another, in a second embodiment;

FIG. 6: shows the sequence of the method according to the invention;

FIG. 7: shows an embodiment with a contact-making wheel in a schematic cross-sectional illustration.

DETAILED DESCRIPTION OF THE INVENTION

Identical reference signs in the figures designate elements having the same function.

The continuous apparatus 1 illustrated in FIGS. 1, 2 and 3 serves for the continuous electrolytic deposition of metal on workpieces WS, here printed circuit boards. The apparatus 1 can serve for example for depositing copper. A copper deposition electrolyte is used in this case.

Installations 1 of this type have a housing 2 having a front wall 3, a rear wall 4, an entry wall 5 for the printed circuit boards WS, an exit wall 6 for the printed circuit boards, and a cover (not illustrated), which together define an interior 7.

The housing 2 is vertically divided into two: a reservoir for a deposition electrolyte AE is situated in a lower compartment 10 ("sump"). An upper compartment 11 is formed by a trough 12, in which the deposition electrolyte AE can likewise be held. Situated in this region is a transport path TB for the printed circuit boards WS that are conveyed through the apparatus 1. The transport path TB is oriented horizontally, such that the printed circuit boards WS are conveyed through the apparatus 1 in horizontal orientation. The printed circuit boards WS enter into the interior 7 of the apparatus 1 through an entry slot 8 in the entry wall 5, pass through the apparatus in the longitudinal direction thereof and exit again from the apparatus 1 through an exit slot 9 in the exit wall 6. Since the deposition electrolyte AE is accumulated above the transport path TB in this upper trough 12, the printed circuit boards WS are in this case fully immersed in the deposition electrolyte AE. In order that the deposition electrolyte AE does not penetrate towards the outside through said slots 8, 9, squeezing rollers arranged one above another (not illustrated) are arranged at the slots 8, 9 within the housing 2. During operation, the deposition electrolyte AE is conveyed from the lower compartment 10 into the upper compartment 11 by means of pumps (not illustrated). For this purpose, the deposition electrolyte AE is conveyed via feed lines 14 into nozzle connections 15, 16 above and below the transport path TB, from which said electrolyte flows out into the trough 12. Said nozzle connections 15, 16 are arranged transversely with respect to the longitudinal direction of the transport path TB (transport direction TR). The nozzles 13 of the nozzle connections 15, 16 are oriented towards the transport path TB, such that deposition electrolyte AE flowing out from them is directed directly against the printed circuit boards WS conveyed on the transport path TB. Moreover, provision is also made of nozzles that are directed against the clamp contacts (not illustrated). The nozzle connections 15, 16 are arranged one behind another in the transport direction TR, such that an intensive flow of the electrolyte AE is applied to the printed circuit boards WS from both sides over the entire length upon passing through the apparatus 1. The lower nozzle connections 16 are shown in FIG. 1. Deposition electrolyte AE from the upper compartment 11 flows away continuously from the trough 12 into the lower compartment 10 again. Moreover, circulating pumps and filters are present (not illustrated).

According to the invention, the upper compartment 11 has three regions: in a first region 17, which extends between the entry slot 8 and the exit slot 9, the metallization of the printed circuit boards WS takes place. This first region is designated as the metallization region 17. It is defined by a metallization apparatus 17. In a second region 18, which extends over a part rearwards with respect to a contact clamp dome 30, contact clamps 31 are demetallized. Said second region is designated as the demetallization region 18. It is defined by a stripping apparatus 18. In a third region 19, which, like the second demetallization region 18, is situated on the rear side of the contact clamp dome 30, there extends a contact coating region 19 formed by a contact coating apparatus 19. In this region, the contact clamps 31 are coated again with deposition metal (copper). The demetallization region 18 is preferably approximately (+/−30%) twice as long as the contact coating region 19.

These three regions 17, 18, 19 can form a common reservoir for receiving an electrolyte AE in the upper compartment 11. The electrolyte AE can then flow between all three regions 17, 18, 19.

Anodes 40, 41 are situated above and below the transport path TB in the metallization region 17.

The dome 30 subdividing the upper compartment 11 into a front region (metallization region 17) and a rear region (demetallization region 18 and contact coating region 19) serves for driving and guiding the current feeding devices 31, which serve for feeding current to the printed circuit boards WS passing through the apparatus 1. The current feeding devices are formed by clamps 31 each having two clamp arms 32, 33, at one end of which there is situated in each case a contact element 34, 35 having a contact area (FIGS. 4, 5). A plurality of such clamps 31 are fixed on a continuous holding device 49, for example a toothed belt, at an identical distance from one another, the contact elements 34, 35 of the clamps 31 each being fitted to the lower end of the clamps. The holding device 49 is held by the contact clamp dome 30 and circulates thereon. The clamp contact arm 32 carrying the upper contact element 34 is movable vertically relative to the clamp contact arm 33. The clamps 31 are guided parallel to the transport path TB in the metallization region 17, wherein the path of the contact elements 34, 35 runs approximately at the level of the transport path TB.

The clamps 31 passing from the first region 17 into the second region 18 and then into the third region 19 remain in the open position in the second region 18 and in the third region 19. The clamps 31 are conveyed in these regions 18, 19 without gripping printed circuit boards WS. In the metallization region 17, the clamps 31 are transported together with printed circuit boards WS and are then closed. The clamps 31 and their holding device 49 are designed to convey the printed circuit boards WS through the interior 7 of the housing 2. For this purpose, the holding device 49 itself is driven and thus transports the printed circuit boards WS via the clamps 31. Therefore, the clamps 31 serve not only for feeding current to the printed circuit boards WS but also as transport members for the latter.

A counterelectrode 20 is situated in the second (demetallization) region 18, and, by means of a connected current source 61, is polarized cathodically relative to the contact clamps 31 running past. This stripping cathode 20 can consist of different individual stripping cathodes. It is arranged within the electrolyte between the contact areas of the electrical contact elements 34, 35 with open contact clamps 31, (as is shown in FIG. 4). It can also be arranged opposite the contact clamps 31 running past (as is shown in FIG. 2). Moreover, it can also be arranged, as viewed in the conveying direction of the contact clamps 31, firstly opposite the contact clamps 31 moving past and then between the contact areas of the electrical contact elements 34, 35. The individual stripping cathodes can be operated with different currents or voltages. For this purpose, they can be connected to current/voltage sources that output different currents/voltages. In particular, as viewed in the transport direction of the contact clamps, the first individual stripping cathode can be operated with a higher current or a higher current density than the last individual stripping cathode.

A counterelectrode 21 is situated in the third (contact coating) region 19 and, by means of a connected current source 62, is polarized anodically relative to the contact clamps 31 running past. This contact coating anode 21 can consist of different individual contact coating anodes. It is arranged within the electrolyte between the contact areas of the electrical contact elements 34, 35 with contact clamps 31 open (as is shown in FIGS. 2, 4). It can also be arranged opposite the contact clamps 31 running past. The distance with respect to the contact elements 34, 35 is then intended to be less than 30 mm. Moreover, as viewed in the conveying direction of the contact clamps 31, it can be arranged firstly opposite the contact clamps 31 running past and then between the contact areas of the electrical contact elements 34, 35, or vice versa. The individual contact coating anodes can be operated with different currents or voltages. For this purpose, they can be connected to current/voltage sources that output different currents/voltages. In particular, as viewed in the transport direction of the contact clamps, the first individual contact coating anode can be operated with a higher current or a higher current density than the last individual contact coating anode.

In the metallization region 17, the contact clamps 31 are supplied with current by means of a current source 60. The electrical contact elements 34, 35 situated at the lower end of the two clamp contact arms 32, 33 serve for transferring current to the printed circuit boards WS by virtue of the fact that they are pressed onto the lower and upper surfaces of said printed circuit boards and an electric current is subsequently transferred to the workpiece via them. Where a metallization of the contact arms 32, 33 dipped into the electrolyte is not desired, they can be surrounded by a shielding shell 48, for example composed of plastic, or be coated with an insulating layer in order to shield them from field lines (shielding shell 48, FIG. 4). In the contact coating apparatus 19, a portion of the contact arms in the vicinity of the contact elements can be concomitantly metallized during the metallization. This coating region 46 is illustrated by way of example in FIG. 4.

FIG. 7 shows, as an alternative configuration of a current feeding device for making electrical contact with the workpiece WS, a contact-making wheel 70, which is connected to the metallization current source 60. In this case, electrical contact is made with the workpiece WS, preferably flat material, such as printed circuit boards, for example, via the cylindrical lateral area of the contact-making wheel 70. The rolling path on the workpiece WS can then be strip-shaped or in the extreme case linear. The material of the cylinder area consists of a conductive material, preferably of titanium or high-grade steel, or of a conductive elastomer. The contact area can be circumferentially closed, such that the same polarity prevails on all area regions of the cylinder area, or the cylinder area consists of a plurality of individual contact areas having an adjustable polarity. For the metallization of the workpiece WS, anodes 40 are situated opposite the workpiece WS. Copper is preferably deposited. With the use of a contact-making wheel 70, too, the apparatus has the three functional regions as metallization region 117, demetallization region 118 and contact coating region 119. The metallization region 117 is situated on the contact-making wheel where the contact area 74 thereof touches the workpiece WS. In the direction of rotation of the contact-making wheel 70, this is followed by the demetallization region 118. The latter has a stripping cathode 120, which is situated opposite the contact area 74 and is polarized negatively relative to the contact area 74, such that metal adhering to the contact area 74 is stripped. The stripping cathode 120 can be electrically shielded from the anode 40 by an insulating shield 71 in order to reduce a metallization of the stripping cathode 120 by the electric field between it and the anode 40. In the case of individual contact areas, the stripping cathode 120 can also be dispensed with, since then the individual contact areas can be polarized positively relative to the workpiece WS and stripping of the metal on the contact area 74 takes place. Situated between the regions of the metallization 117 and the demetallization 118 is the region of the contact coating 119 according to the invention. The latter has a contact coating anode 121, which is situated opposite the contact area 74 and is polarized positively relative to the contact area 74. In order to suppress a disturbing influence of the other electrodes, the contact coating anode 121 can be electrically shielded from the anode 40 by the insulating shield 71 and from the stripping cathode 120 by the insulating shield 72. The contact coating anode 121 can also be dispensed with if the anode 40 performs the task of the contact coating anode 121, since it is polarized positively relative to the contact area 74. The region of the demetallization 118 can be larger than the region of the contact coating 119. By means of nozzles, for example, a flow, for example comprising the metallization electrolyte, can be applied to the contact-making wheel 70 in the metallization region 117 or in the demetallization region 118 or in the contact coating region 119. The contact-making wheel 70 can make contact with the planar workpiece on one side or on two sides, that is to say on the front and rear sides with then at least two contact-making wheels 70.

FIG. 6 shows the sequence of the method according to the invention:

Firstly (step A) the above-described apparatus 1 according to the invention comprising the metal deposition apparatus 17, in which the printed circuit board WS, the anodes 40, 41, the deposition electrolyte AE, the device for electric current generation 60 and contact clamps 31 with the electrical contact elements 34, 35 are situated, is provided.

After the printed circuit board WS has been transported into the apparatus 1 and has reached a region in which the contact clamps 31 which come from the side and, in accordance with method step B), are coated with copper at least on the contact areas of the contact elements 34, 35 pivot in on their path parallel to the transport path TB of the printed circuit board WS, the contact elements 34, 35 grip the printed circuit board WS and make contact with it (method step C). During subsequent transport through the metallization region 17, the printed circuit board WS is polarized cathodically relative to anodes 40, 41 by the feeding of current via the clamp contacts 31, such that copper deposits on the printed circuit board (method step D). At the same time, a metallization of the contact elements 34, 35 and in part also of the adjacent regions of the contact clamps 31 in the region of the clamp contact arms 32, 33 can take place.

As soon as the printed circuit board WS has reached the outlet region of the metallization region 17, the contact clamps 31 successively release the printed circuit board WS and the printed circuit board WS is conveyed out of the apparatus 1. The contact clamps 31 are conveyed into the second region 18 in the rear part of the dome 30, where the contact clamps 31 are polarized anodically relative to the stripping cathodes 20 arranged there, such that the deposited copper is stripped away again (method step E). This process can be carried out with a current of 0.01-2.5 A per clamp. After passing through a part of the return section at the rear part of the dome 30, the contact clamps 31 are demetallized. They subsequently pass into the third (contact coating) region 19, where they are polarized cathodically relative to contact coating anodes 21. Starting from this method step, the previously described method steps B to E are repeated (method step F). In the third region, copper is deposited with a current of 0.2-10 A per clamp on the areas to be metallized (method step B). After a copper layer having a desired thickness has been deposited, the clamps 31 pivot into the metallization region 17 again and take up there further untreated printed circuit boards WS.

LIST OF REFERENCE SIGNS

1 Continuous installation
2 Housing
3 Front wall
4 Rear wall
5 Entry wall
6 Exit wall
7 Interior
8 Entry slot
9 Exit slot
10 Lower compartment
11 Upper compartment
12 Trough
13 Nozzles
14 Feed lines
15, 16 Nozzle connection
17, 117 First (metallization) region, metallization apparatus
18, 118 Second (demetallization) region, stripping apparatus
19, 119 Third (contact coating) region, contact coating apparatus
20, 120 Counterelectrode, stripping cathode
21, 121 Counterelectrode, contact coating anode
30 Contact clamp dome
31 Contact clamps
32, 33 Clamp contact arm
34, 35 Contact element
36 Angled upper end of the clamp contact arm 32
37, 38 Sliding bearing body
39 Compression spring
40, 41 Anodes
44, 45, 74 Contact area
48 Shielding shell
49 Holding device, transport chain, toothed belt, contact-making device
50 Copper multiple-stranded wire
51 Sliding contact
52 Copper rail
60, 61, 62 Current source
70 Contact-making wheel
71, 72 Shield
AE Deposition electrolyte
TB Transport path
TR Transport direction
WS Workpiece, printed circuit board

What is claimed is:

1. An apparatus for electrolytically depositing a deposition metal on a workpiece, comprising:
   (I) in a first region of the apparatus:
   (a) an electrolytic depositing apparatus, which has at least one anode and at least one current feeding device, each current feeding device having one electrical contact element for making electrical contact with the workpiece, each electrical contact element having at least one contact area, wherein the at least one anode and the at least one current feeding device can be brought into contact with a deposition electrolyte; and
   (b) a device for electric current generation;
   (II) in a second region of the apparatus:
   (a) a stripping apparatus for removing deposition metal from the at least one current feeding device, wherein the stripping apparatus comprises a stripping cathode; and
   (b) a current source which is designed so as to polarize the stripping cathode cathodically vis-à-vis the at least one current feeding device;
   (III) in a third region of the apparatus:
   (a) a contact coating apparatus for depositing the deposition metal on the respective contact area on the electrical contact elements, in which contact coating apparatus the at least one electrical contact element is not in contact with the workpiece, wherein the contact coating apparatus comprises a contact coating anode; and (b) a current source which is designed so as to polarize the electrical contact elements cathodically vis-à-vis the contact coating anode;

wherein the at least one current feeding device is a contact clamp having said contact areas; wherein the contact clamp has two electrical contact elements, each electrical contact element having a said contact area, and wherein in the second region and in the third region, contact areas of the clamp remain in the position spaced apart from one another.

2. The apparatus for electrolytically depositing a deposition metal on a workpiece according to claim 1, wherein the apparatus is a continuous apparatus for continuous electrolytic metal deposition with a plurality of current feeding devices, in which the current feeding devices are held on a holding device forming a circulation, wherein the continuous apparatus has, in the first region of the circulation in the apparatus, a transport path for the workpiece and a guide for the current feeding devices parallel to the transport path, such that the electrical contact elements can be brought into contact with the workpieces and deposition metal can be deposited on the workpieces, and wherein the continuous apparatus is designed, at the end of the first region, to release the contact between the workpieces and the electrical contact elements, wherein the stripping apparatus for removing the deposition metal deposited on the electrical contact elements furthermore forms the second region of the circulation in the apparatus, and wherein the contact coating apparatus for depositing the deposition metal on the electrical contact elements forms the third region of the circulation in the apparatus.

3. The apparatus for electrolytically depositing a deposition metal on a workpiece according to claim 2, wherein the transport path is horizontal.

4. The apparatus for electrolytically depositing a deposition metal on a workpiece according to claim 2, wherein the holding device is a continuously circulating transport belt or a continuously circulating transport chain.

5. The apparatus for electrolytically depositing a deposition metal on a workpiece according to claim 2, wherein the stripping apparatus is at least half as long and at most three times as long as the contact coating apparatus.

6. The apparatus for electrolytically depositing a deposition metal on a workpiece according to claim 2, wherein the at least one electrical contact element is made of a base metal which has a surface roughness having a roughness value Ra in a range of from 0.2 to 10 μm.

7. The apparatus for electrolytically depositing a deposition metal on a workpiece according to claim 2, wherein the at least one contact clamp is designed so as to exert a clamping pressure per unit of a contact area on the workpiece which is from 0.15 to 2.5 N/mm2.

8. The apparatus for electrolytically depositing a deposition metal on a workpiece according to claim 2, wherein the electrical contact elements are arranged parallel to one another and aligned in a manner situated parallel opposite one another.

9. The apparatus for electrolytically depositing a deposition metal on a workpiece according to claim 2, wherein the at least one electrical contact element is made of a metal selected from the group consisting of titanium, niobium, and stainless steel.

10. The apparatus for electrolytically depositing a deposition metal on a workpiece according to claim 2, wherein stripping cathode is arranged opposite the at least one current feeding device.

11. The apparatus for electrolytically depositing a deposition metal on a workpiece according to claim 2, wherein a contact coating anode is arranged between two contact elements of a respective current feeding device.

12. The apparatus for electrolytically depositing a deposition metal on a workpiece according to claim 2, wherein the contact coating anode is disposed in the contact coating apparatus with respect to the at least one current feeding device so as to deposit metal on areas of the at least one current feeding device which are adjacent to a respective contact area on the at least one electrical contact element.

13. The apparatus for electrolytically depositing a deposition metal on a workpiece according to claim 2, wherein the contact coating anode is made of titanium which is coated with platinum or coated with a mixed oxide.

14. The apparatus for electrolytically depositing a deposition metal on a workpiece according to claim 1, wherein the at least one electrical contact element is made of a base metal which has a surface roughness having a roughness value Ra in a range of from 0.2 to 10 μm.

15. The apparatus for electrolytically depositing a deposition metal on a workpiece according to claim 1, wherein the at least one contact clamp is designed so as to exert a clamping pressure per unit of a contact area on the workpiece which is from 0.15 to 2.5 N/mm2.

16. The apparatus for electrolytically depositing a deposition metal on a workpiece according to claim 1, wherein the electrical contact elements are arranged parallel to one another and aligned in a manner situated parallel opposite one another.

17. The apparatus for electrolytically depositing a deposition metal on a workpiece according to claim 1, wherein the at least one electrical contact element is made of a metal selected from the group consisting of titanium, niobium, and stainless steel.

18. The apparatus for electrolytically depositing a deposition metal on a workpiece according to claim 1, wherein stripping cathode is arranged opposite the at least one current feeding device.

19. The apparatus for electrolytically depositing a deposition metal on a workpiece according to claim 1, wherein a contact coating anode is arranged between two contact elements of a respective current feeding device.

20. The apparatus for electrolytically depositing a deposition metal on a workpiece according to claim 1, wherein the contact coating anode is disposed in the contact coating apparatus with respect to the at least one current feeding device so as to deposit metal on areas of the at least one current feeding device which are adjacent to the respective contact area on the at least one electrical contact element.

21. The apparatus for electrolytically depositing a deposition metal on a workpiece according to claim 1, wherein the contact coating anode is made of titanium which is coated with platinum or coated with a mixed oxide.

* * * * *